(12) United States Patent
Wu

(10) Patent No.: US 6,280,295 B1
(45) Date of Patent: Aug. 28, 2001

(54) APPARATUS AND METHOD TO POLISH A WAFER USING ABRASIVE FLOW MACHINING

(75) Inventor: Hsiao Che Wu, Chung-Li (TW)

(73) Assignees: ProMOS Technologies Inc. (TW); Mosel Vitelic Inc., Munich (DE)

( * ) Notice: Subject to any disclaimer, the term of this patent is extended or adjusted under 35 U.S.C. 154(b) by 0 days.

(21) Appl. No.: 09/483,875

(22) Filed: Jan. 18, 2000

(51) Int. Cl.$^7$ ...................................................... B24B 1/00
(52) U.S. Cl. .................................. 451/36; 451/59; 451/113
(58) Field of Search .............................. 451/41, 36, 37, 451/56, 59, 60, 63, 113, 114

(56) References Cited

U.S. PATENT DOCUMENTS

| | | | |
|---|---|---|---|
| 5,040,336 | * 8/1991 | Ahern | 51/7 |
| 5,125,191 | * 6/1992 | Rhoades | 51/317 |
| 5,582,540 | * 12/1996 | Su et al. | 451/259 |
| 5,746,646 | * 5/1998 | Shibano | 451/36 |

* cited by examiner

Primary Examiner—Timothy V. Eley
Assistant Examiner—Dung Van Nguyen
(74) Attorney, Agent, or Firm—Darby & Darby

(57) ABSTRACT

An apparatus and method to polish a wafer using abrasive flow machining (AFM) is provided. Under a high-pressure condition, the wafer is polished by flowing abrasive media with high viscosity, on the wafer in order to planarize the wafer. Therefore, the polishing efficiency is higher, and the attained roughness is lower than the conventional method. In addition, the selectivity of this method is lower.

18 Claims, 1 Drawing Sheet

APPARATUS AND METHOD TO POLISH A WAFER USING ABRASIVE FLOW MACHINING

FIELD OF THE INVENTION

The invention relates to an apparatus and method to polish a wafer using abrasive flow machining (AFM), and in particular to a polishing apparatus and method with high efficiency and stability.

DESCRIPTION OF THE RELATED ART

Planarization is a very important technology in wafer processing. Currently, chemical mechanical polishing (CMP) is a common manner to planarize the wafer. However, CMP technology has a lot of disadvantages, as enumerated below:

(1) a lot of water is needed,
(2) a lot of chemical treatment using slurry is required,
(3) short life time of every consumable part of the polishing apparatus,
(4) short PM time,
(5) dishing and other errors,
(6) a lot of vibration and noise is produced,
(7) the processed wafer is easily scratched;
(8) the quality of the polishing pad is unstable;
(9) precise control is required,
(10) the pre-polish topography will affect the result of the polish,
(11) the polishing apparatus is easily corroded,
(12) the supply tube and the discharge pipe of the slurry is easily clogged, and
(13) chemical evaporation results in pollution.

SUMMARY OF THE INVENTION

In view of the above problem, an object of the invention is to provide an apparatus and method to polish a wafer using abrasive flow machining. Under a high-pressure condition, the wafer is polished by abrasive media with high viscosity in order to planarize the wafer. Therefore, the polishing efficiency is higher, and the attained roughness is lower than by the conventional method. In addition, the selectivity of this method is lower.

To attain the above object, the polishing apparatus comprises a table, a carrier, an abrasive media supply device, a pressing device and an abrasive media-removing device. The table is used for supporting the wafer disposed thereon. The carrier is disposed on the table in an detachable manner. The abrasive media supply device, communicating with the carrier, is used for supplying abrasive media to a space defined by the carrier and the table. The pressing device, communicating with the carrier, is used for applying pressure to the abrasive media inside the space. The abrasive media-removing device, communicating with the carrier, is used for supplying high-pressure air to the space to remove the abrasive media.

Furthermore, the abrasive media supply device consists of a first tube, a first valve and a pump. The first tube is communicated with the carrier at one end. The first valve is attached to the first tube. The pump is communicated with the other end of the first tube.

Furthermore, the pressing device consists of a rod and a first cylinder. The rod is located inside the carrier partly and in contact with the abrasive media at one end. The first cylinder is connected with the other end of the rod.

Furthermore, the abrasive media-removing device consists of a channel, a check valve, a second tube, a second valve and an air source. The channel is located inside the rod. The check valve is attached to one end, in contact with the abrasive media inside the carrier, of the channel. The second tube is communicated with the other end of the channel. The second valve is attached to the second tube. The air source is communicated with the other end of the second tube.

Furthermore, the apparatus further comprises a robot, a lift pin, a second cylinder, a release hole and a cooling path. The robot is used for transferring the wafer. The lift pin is moveably disposed inside the table. The second cylinder, connected with the carrier, is used for moving the carrier. The release hole is disposed on the carrier. The cooling path is disposed inside the table.

The method of the invention comprises the steps of: (a) providing the polishing apparatus; (b) transferring the wafer on the lift pin by means of the robot; (c) positioning the wafer on the table by lowering the lift pin; (d) positioning the carrier on the table by means of the second cylinder to form the space between the carrier and the table; (e) supplying the abrasive media to the space through the first tube and the first valve by means of the pump; (f) shutting off the first valve when the abrasive media inside the space reaches a predetermined amount; (g) applying pressure to the abrasive media inside the space by moving the first cylinder to polish the wafer and discharge the abrasive media through the release hole; (h) supplying the high-pressure air from the air source through the second tube, the second valve, the channel and the check valve to the space to remove the abrasive media through the release hole; (i) after separating the carrier from the table by means of the second cylinder, separating the wafer from the table by raising the lift pin; and (j) removing the wafer from the table by means of the robot.

Furthermore, the size of the abrasive media is from 800 to 0.5 μm. The temperature during the polishing is from 25 to 80° C. The abrasive media is aluminum oxide, silica, silicon carbide or diamond. The pressure applied to the abrasive media is from 100 to 3000 psi. The discharge rate through the release hole is from 7 to 250 L/min.

BRIEF DESCRIPTION OF THE DRAWINGS

The invention is hereinafter described in detail by reference to the accompanying drawings in which.

DETAILED DESCRIPTION OF THE INVENTION

Figure 1:
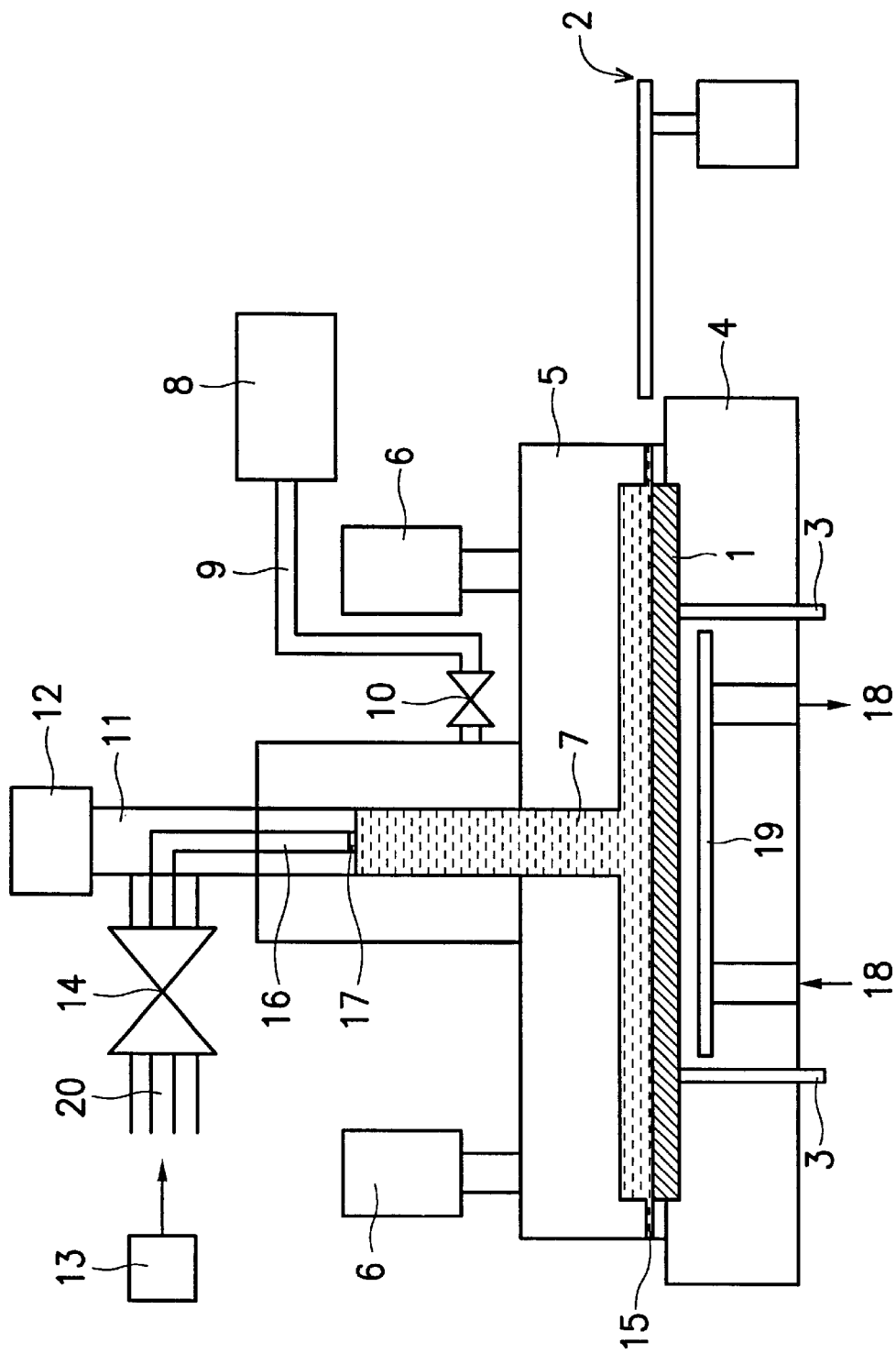
FIG. 1 is a schematic diagram showing the apparatus to polish a wafer using abrasive flow machining of an embodiment of the present invention.

Referring to FIG. 1, it shows a method and apparatus to polish a wafer using abrasive flow machining of an embodiment of the present invention.

The apparatus of this invention consists of a table 4, a carrier 5, an abrasive media supply device, a pressing device and an abrasive media-removing device. The table 4, serving as a base of the apparatus, is used for supporting a wafer 1 and the carrier 5 disposed thereon. The carrier 5, transferred by means of a second cylinder 6, is hood-typed. When the carrier abuts against the table 4, abrasive media 7 to be flowed into the carrier 5 flows into a predetermined space defined by the carrier 5 and the table 4.

The abrasive media supply device, consisting of a first tube 9, a first valve 10 and a pump 8, is used for supplying the abrasive media 7 into the space between the carrier 5 and the table 4. One end of the first tube 9 is communicated with the carrier 5, and the other end thereof is communicated with the pump 8 to supply the abrasive media 7 to the carrier 5. The first valve 10 is attached to the first tube 9 to control the amount of the abrasive media 7 through the first tube 9. The pump 8 forces the abrasive media 7 to flow into the carrier 5.

The pressing device, consisting of a rod 11 and a first cylinder 12, is used for applying pressure to the abrasive media 7 inside the carrier 5. Part of the rod 11, partly located inside the carrier 5, is hollow, and one end thereof abuts against the abrasive media 7 inside the carrier 5. The first cylinder 12, connected with the other end of the rod 11, is used for moving the rod 11.

The abrasive media-removing device, consisting of a channel 16, a check valve 17, a second tube 20, a second valve 14 and an air source 13, is used for supplying high-pressure air into the carrier 5 to remove the remained abrasive media 7. The channel 16, used for the path of the high-pressure air flowing into the carrier 5, is the hollow part of the rod 11. The check valve 17, used for keeping the high-pressure air from the channel 16 flowing toward the carrier 5, is attached to one end, contact with the abrasive media 7 inside the carrier 5, of the channel 16. One end of the second tube 20, used as a path of the high-pressure air flowing into the channel 16, is communicated with the other end of the channel 16, and the other end thereof is communicated with the air source 13. The second valve 14, used for controlling the high-pressure air, is attached to the second tube 20. The air source 13, used for supplying the high-pressure air, is communicated with the other end of the second tube 20.

In addition, the apparatus further comprises a robot 2, a lift pin 3, a second cylinder 6, a release hole 15 and a cooling path 19. The robot 2 is used for transferring the wafer 1. The lift pin 3, making the deposition and the separation between the wafer 1 and the table 4 easier, is moveably disposed inside the table 4. The second cylinder 6, connected with the carrier 5, is used for moving the carrier 5. The release hole 15, used for discharging the abrasive media 7, is disposed on the carrier 5. The cooling path 19 is disposed inside the table 4. Since the cooling water 18 flows inside the cooling path 19, the cooling path 19 can keep the temperature of the wafer 1 constant during the polishing process.

The method of this invention comprises the steps of: (a) transferring the wafer 1 on the lift pin 3 by means of the robot 2; (b) positioning the wafer 1 on the table 4 by lowering the lift pin 3 while the robot 2 returning to home; (c) positioning the carrier 5 on the table 4 by means of the second cylinder 6 to form a predetermined space between the carrier 5 and the table 4; (d) supplying the abrasive media 7 to the space through the first tube 9 and the first valve 10 by means of the pump 8; (e) shutting off the first valve 10 when the abrasive media 7 inside the space reaches a predetermined amount; (f) applying pressure to the abrasive media 7 inside the space by moving the first cylinder 11 to polish the wafer 1 and discharging the mixture of the abrasive media 7 and the substance produced from the surface of the wafer 1 through the release hole 15; (g) supplying the high-pressure air from the air source 13 through the second tube 20, the second valve 14, the channel 16 and the check valve 17 to the space to remove the remaining abrasive media 7 through the release hole 15; (i) after separating the carrier 5 from the table 4 by means of the second cylinder 6, removing the wafer 1 from the table 4 by raising the lift pin 3; and (j) removing the wafer 1 from the lift pin 3 by means of the robot 2.

Furthermore, the powder size of the abrasive media in this invention is from 800 to 0.5 $\mu$m in order to be stiff to fluid. During the polishing process, the temperature of the wafer is from 25 to 80° C. The abrasive media is aluminum oxide, silica, silicon carbide or diamond preferably. The pressure, applied to the wafer by the pressing means, is from 100 to 3000 psi. The discharge rate of the abrasive media through the release hole is from 7 to 250 L/min.

In summary, the advantages of this invention is described as follows:

(1) high removal rate: typically 0.0013 to 0.5 mm/min (determined by the polishing condition), (2) better roughness (Ra): 2 to 20 $\mu$in (typically $\frac{1}{10}$ of prior roughness)

(3) low selectivity: since the polishing method is physical, it will not have the same drawback of the conventional chemical method. In other word, the polishing result of this invention will not depend on the material of the wafer.

It is to be understood that although the present invention has been described with reference to particular preferred embodiments, it should be appreciated that numerous modifications, variations and adaptations may be made without departing from the scope of the invention as defined in the claims.

What is claimed is:

1. An apparatus for polishing a wafer by flowing abrasive media on the wafer, which comprises:

a table used for supporting the wafer disposed thereon;

a carrier disposed on the table in an detachable manner;

an abrasive media supply device, communicating with the carrier, used for supplying the abrasive media to a space defined by the carrier and the table;

a pressure device, communicating with the carrier, used for applying pressure to the abrasive media inside the space;

an abrasive media-removing device, communicating with the carrier, used for supplying high-pressure air to the space to remove the abrasive media inside the space wherein the abrasive media supply device further comprises:

a first tube communicated with the carrier at one end;

a first valve attached to the first tube; and a pump communicated with the other end of the first tube.

2. The apparatus as claimed in claim 1 wherein the pressure device comprises:

a rod moveably partly located inside the carrier and in contact with the abrasive media at one end; and a first cylinder connected with the other end of the rod.

3. The apparatus as claimed in claim 2, wherein the abrasive media-removing device comprises:

a channel located inside the rod;

a check valve attached to one end, in contact with the abrasive media inside the carrier, of the channel;

a second tube communicated with the other end of the channel at one end;

a second valve attached to the second tube; and an air source communicated with the other end of the second tube.

4. The apparatus as claimed in claim 3, further comprising:

a robot used for transferring the wafer;

a lift pin moveably disposed inside the table;

a second cylinder, connected with the carrier, used for moving the carrier;

a release hole disposed on the carrier; and a cooling path disposed inside the table.

5. A method for polishing a wafer by flowing abrasive media on the wafer, which comprises the steps of:

(a) providing the apparatus as claimed in claim 1;

(b) positioning the wafer on the table;

(c) positioning the carrier on the table to form the space;

(d) supplying a predetermined amount of the abrasive media to the space;

(e) applying pressure to the abrasive media inside the space to polish the wafer and discharge the abrasive media;

(f) supplying the high-pressure air to the space to remove the abrasive media; and (g) after separating the carrier from the table, removing the wafer from the table.

6. The method as claimed in claim 5, wherein the size of the abrasive media is from 800 to 0.5 μm.

7. The method as claimed in claim 6, wherein the temperature during the polishing is from 25 to 80° C.

8. The method as claimed in claim 7, wherein the abrasive media is aluminum oxide, silica, silicon carbide or diamond.

9. The method as claimed in claim 8, wherein the pressure applying on the abrasive media is from 100 to 3000 psi.

10. The method as claimed in claim 9, wherein the discharge rate of the abrasive media out of the space is from 7 to 250 L/min.

11. A method for polishing a wafer by flowing abrasive media on the wafer, which comprises the steps of:

(a) providing the apparatus as claimed in claim 4, (b) transferring the wafer on the lift pin by means of the robot;

(c) positioning the wafer on the table by lowering the lift pin;

(d) positioning the carrier on the table by means of the second cylinder to form the space between the carrier and the table;

(e) supplying the abrasive media to the space through the first tube and the first valve by means of the pump;

(f) shutting off the first valve when the abrasive media inside the space reaches a predetermined amount;

(g) applying pressure to the abrasive media inside the space by moving the first cylinder to polish the wafer and discharge the abrasive media through the release hole;

(h) supplying the high-pressure air from the air source through the second tube, the second valve, the channel and the check valve to the space to remove the abrasive media through the release hole;

(i) after separating the carrier from the table by means of the second cylinder, separating the wafer from the table by raising the lift pin; and (j) removing the wafer from the table by means of the robot.

12. The method as claimed in claim 11, wherein the discharge rate through the release hole is from 7 to 250 L/min.

13. An apparatus for polishing a wafer comprising:

a table supporting the wafer disposed thereon;

a carrier detachably disposed on the table;

a supply device communicating with the carrier and supplying abrasive media to a space defined by the carrier and the table;

a pressure device communicating with the carrier and applying pressure to the abrasive media inside the space; and a removing device communicating with the carrier and supplying high pressure air to the space for removing the abrasive media inside the space.

14. A method for polishing a wafer comprising the steps of:

disposing the wafer onto a table;

detachably disposing a carrier onto the table;

supplying abrasive media to a space defined by the carrier and the table;

applying pressure to the abrasive media inside the space; and supplying high pressure air to the space for removing the abrasive media inside the space.

15. The method of claim 14 further comprising the steps of:

providing a first tube communicated with the carrier at one end;

attaching a first valve to the first tube; and providing a pump communicated with the other end of the first tube.

16. The method of claim 15 further comprising the steps of:

providing a rod partly located inside the carrier and in contact with the abrasive media at one end; and connecting a first cylinder with the other end of the rod.

17. The method of claim 16 further comprising the steps of:

providing a channel located inside the rod;

attaching a check valve to one end of the channel and in contact with the abrasive media inside the carrier;

providing a second tube communicated with the other end of the channel at one end;

attaching a second valve to the second tube; and providing an air source communicated with the other end of the second tube.

18. The method of claim 17 further comprising the steps of:

providing a robot for transferring the wafer;

moveably disposing a lift pin inside the table;

connecting a second cylinder with the carrier for moving te carrier;

disposing a release hole on the carrier; and disposing a cooling path inside the table.

* * * * *